(12) United States Patent
Lee et al.

(10) Patent No.: US 11,882,736 B2
(45) Date of Patent: Jan. 23, 2024

(54) DISPLAY DEVICE

(71) Applicant: Samsung Display Co., LTD., Yongin-si (KR)

(72) Inventors: Changmoo Lee, Suwon-si (KR); Donghyeon Lee, Seoul (KR); Jongin Ahn, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 417 days.

(21) Appl. No.: 17/332,437

(22) Filed: May 27, 2021

(65) Prior Publication Data
US 2022/0109041 A1 Apr. 7, 2022

(30) Foreign Application Priority Data
Oct. 7, 2020 (KR) .................. 10-2020-0129715

(51) Int. Cl.
*H10K 59/131* (2023.01)
*H01L 25/18* (2023.01)
*H05K 1/18* (2006.01)
*H10K 50/87* (2023.01)
*H10K 50/844* (2023.01)
*H10K 77/10* (2023.01)
*H05K 1/14* (2006.01)
(Continued)

(52) U.S. Cl.
CPC .......... *H10K 59/131* (2023.02); *H01L 25/18* (2013.01); *H05K 1/189* (2013.01); *H10K 50/844* (2023.02); *H10K 50/87* (2023.02); *H10K 77/111* (2023.02); *H05K 1/0346* (2013.01); *H05K 1/147* (2013.01); *H05K 2201/0154* (2013.01); *H05K 2201/10128* (2013.01); *H10K 2102/311* (2023.02)

(58) Field of Classification Search
CPC .... H10K 59/131; H10K 59/129; H10K 50/87; H10K 50/841; H10K 50/844; H10K 77/111; H10K 2102/311; H01L 25/18; H01L 23/552; H05K 1/189; H05K 1/0436; H05K 1/147; H05K 1/028; H05K 1/0281; H05K 1/148; H05K 1/0283; H05K 2201/0154; H05K 2201/10128; H05K 2201/10363; Y02E 10/549
See application file for complete search history.

(56) References Cited

U.S. PATENT DOCUMENTS

2019/0347989 A1* 11/2019 Lee ................. H10K 59/124

FOREIGN PATENT DOCUMENTS

| KR | 10-2017-0052807 | 5/2017 |
|----|-----------------|--------|
| KR | 10-2019-0041252 | 4/2019 |

(Continued)

*Primary Examiner* — Anne M Hines
*Assistant Examiner* — Jose M Diaz
(74) *Attorney, Agent, or Firm* — KILE PARK REED & HOUTTEMAN PLLC

(57) ABSTRACT

A display device includes a display panel including a bending area and a non-bending area adjacent to the bending area, a base substrate disposed under the display panel and including a through-hole overlapping the bending area, a conductive part filling the through-hole, a flexible printed circuit board including a first surface connected to the conductive part and second a surface opposite to the first surface, a first film contacting the first surface of the flexible printed circuit board overlapping the non-bending area, and a protection member contacting an upper surface of the first film.

15 Claims, 9 Drawing Sheets

(51) Int. Cl.
*H05K 1/03* (2006.01)
*H10K 102/00* (2023.01)

(56) References Cited

FOREIGN PATENT DOCUMENTS

KR   10-2019-0129154   11/2019
KR   10-2019-0130105   11/2019

* cited by examiner

DISPLAY DEVICE

CROSS-REFERENCE TO RELATED APPLICATION(S)

This application claims priority to and benefits of Korean Patent Application No. 10-2020-0129715 under 35 USC § 119, filed on Oct. 7, 2020 in the Korean Intellectual Property Office (KIPO), the entire contents of which are incorporated herein by reference.

BACKGROUND

1. Technical Field

Embodiments relate to a display device, more particularly, embodiments relate to a display device including a bending area.

2. Description of the Related Art

To implement a large screen on small portable display device, it may be necessitated that the size of a transparent area of a window increases to be larger and a size of a bezel area of the window decreases to be smaller. The bezel area requires a sufficient size such that wiring portions formed at edges of a display panel or a touch sensing structure provided inside the display device and flexible printed circuit boards connected to the wiring portions may not be exposed to an outside. Therefore, there may be a limit to reducing the size of the bezel area.

The flexible printed circuit boards may be bent to reduce the size of the bezel area. For example, one end of the flexible printed circuit board may be connected to a wiring portion formed at an edge of the display panel, and the other end of the flexible printed circuit board may be connected to a driving circuit chip. When the flexible printed circuit board is bent, the driving circuit chip may be positioned under the display panel. Accordingly, the size of the bezel area may be reduced. When the flexible printed circuit board is bent, the bent part of the flexible printed circuit board may be unstable, so process handling may be poor, and a crack may occur in the circuit wiring at the bent part.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device including a bending area.

A display device according to an embodiment may include a display panel including a bending area and a non-bending area adjacent to the bending area, a base substrate disposed under the display panel and including a through-hole overlapping the bending area, a conductive part filling the through-hole, a flexible printed circuit board including a first surface connected to the conductive part and a second surface opposite to the first surface; a first film contacting the first surface of the flexible printed circuit board overlapping the non-bending area, and a protection member contacting an upper surface of the first film.

According to an embodiment, the second surface of the flexible printed circuit board overlapping the bending area may be exposed.

According to an embodiment, a step may be formed in the flexible printed circuit board overlapping the bending area with respect to the base substrate.

According to an embodiment, the protection member may include a heat dissipation member disposed on the first film and a buffer member disposed on the heat dissipation member.

According to an embodiment, the display device may further include a second film disposed between the buffer member and the base substrate.

According to an embodiment, the base substrate and the flexible printed circuit board may include a same material.

According to an embodiment, the base substrate and the flexible printed circuit board may include plastic.

According to an embodiment, the display device may further include a driving circuit chip contacting the second surface of the flexible printed circuit board overlapping the non-bending area.

According to an embodiment, the display device may further include a cover tape covering the driving circuit chip and extending along the second surface of the flexible printed circuit board.

According to an embodiment, the display device may further include a printed circuit board spaced apart from the driving circuit chip and contacting an end of the second surface of the flexible printed circuit board.

According to an embodiment, the display device may further include an optical member disposed on the display panel and a cover window disposed on the optical member.

According to an embodiment, the cover window may include plastic.

A display device according to an embodiment may include a display panel including a bending area and a non-bending area adjacent to the bending area; a base substrate disposed under the display panel and including a through-hole overlapping the bending area, a conductive part filling the through-hole, a flexible printed circuit board including a first surface connected to the conductive part and a second surface opposite to the first surface, a first film contacting the first surface overlapping the non-bending area, and a second film contacting an upper surface of the first film.

According to an embodiment, the second surface of the flexible printed circuit board overlapping the bending area may be exposed.

According to an embodiment, the second film may be disposed between the first film and the base substrate.

A display device according to an embodiment, a flexible printed circuit board may be connected to the conductive part penetrating a base substrate without bending, a bending protection layer may be not applied to a second side of the flexible printed circuit board, and a spacer may be not disposed between a first film and a protection member. Accordingly, a size of a bezel area of the display device may be reduced. In addition, an occurrence of cracks in the flexible printed circuit board overlapping the bending area BA may be reduced or substantially prevented.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Figure 1:
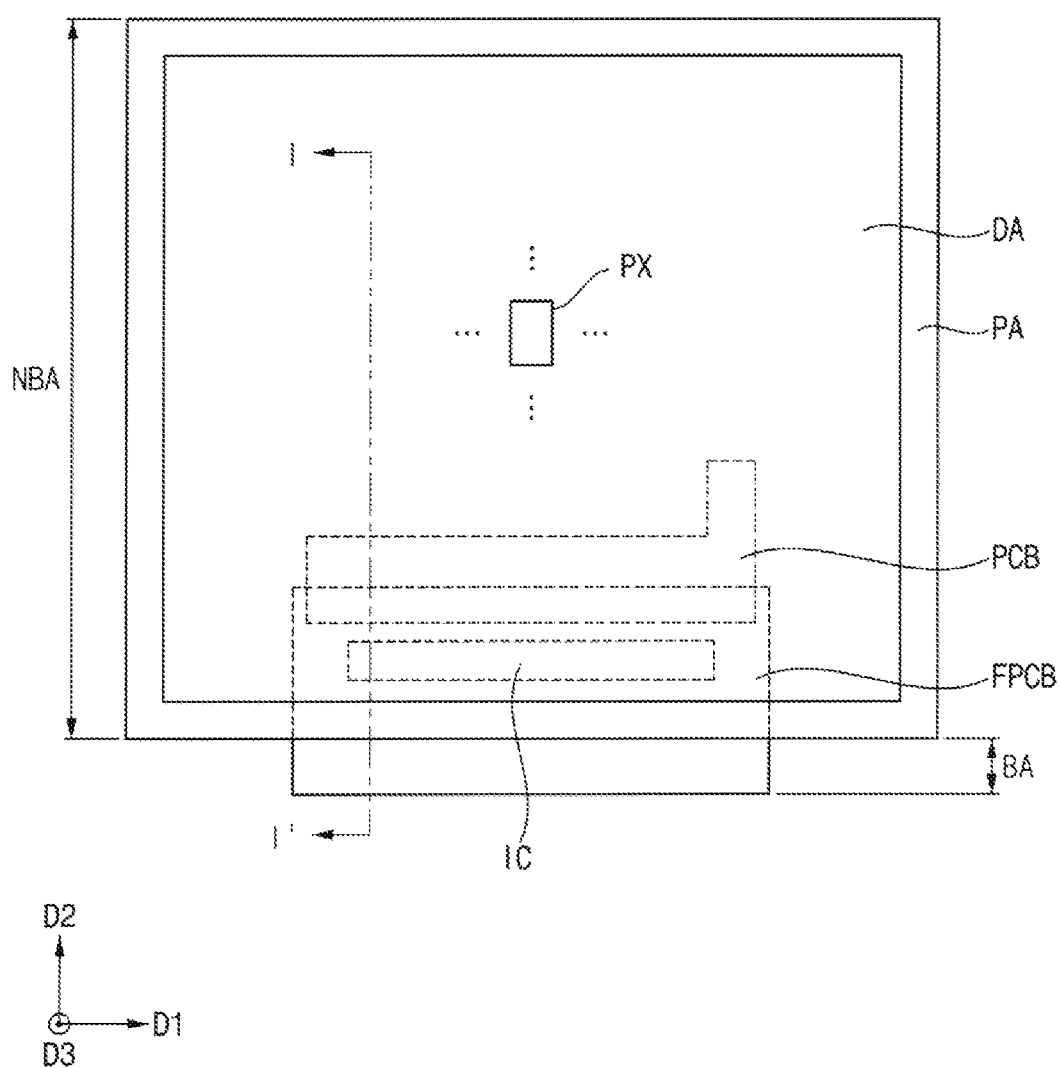
FIG. 1 is a schematic plan view illustrating a display device according to an embodiment.

Hereinafter, display devices in accordance with embodiments will be explained in detail with reference to the accompanying drawings. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween.

It will be understood that the terms "connected to" or "coupled to" may include a physical or electrical connection or coupling.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view illustrating a display device according to an embodiment.

Referring to FIG. 1, a display device 100 according to an embodiment includes a display area DA in which an image is displayed, and a peripheral area PA adjacent to the display area DA and surrounding the display area DA.

Pixels PX including an organic light emitting device may be disposed in the display area DA to generate light according to a driving signal. Each of the pixels PX may be arranged in a first direction D1 and a second direction D2 orthogonal to the first direction D1. The peripheral area PA may be adjacent to the display area DA and may surround an edge of the display area DA. A circuit structure for driving the pixels PX of the display area DA may be formed in the peripheral area PA.

The display device 100 may include a bending area BA and a non-bending area NBA. The bending area BA may be located adjacent to the non-bending area NBA. The bending area BA may be bent along a bending axis.

The flexible printed circuit board FPCB may be disposed in the bending area BA and the non-bending area NBA of the display device 100. The driving circuit chip IC and the printed circuit board PCB may be disposed in the non-bending area NBA of the display device 100. The driving circuit chip IC and the printed circuit board PCB may be disposed to be spaced apart from each other.

The flexible printed circuit board FPCB may electrically connect the display device 100 and the printed circuit board PCB. The driving circuit chip IC and the printed circuit board PCB may provide driving signals to the display device 100. The driving signal may include signals that drive the display device 100 such as a driving voltage, a gate signal, a data signal, and the like.

Figure 2:
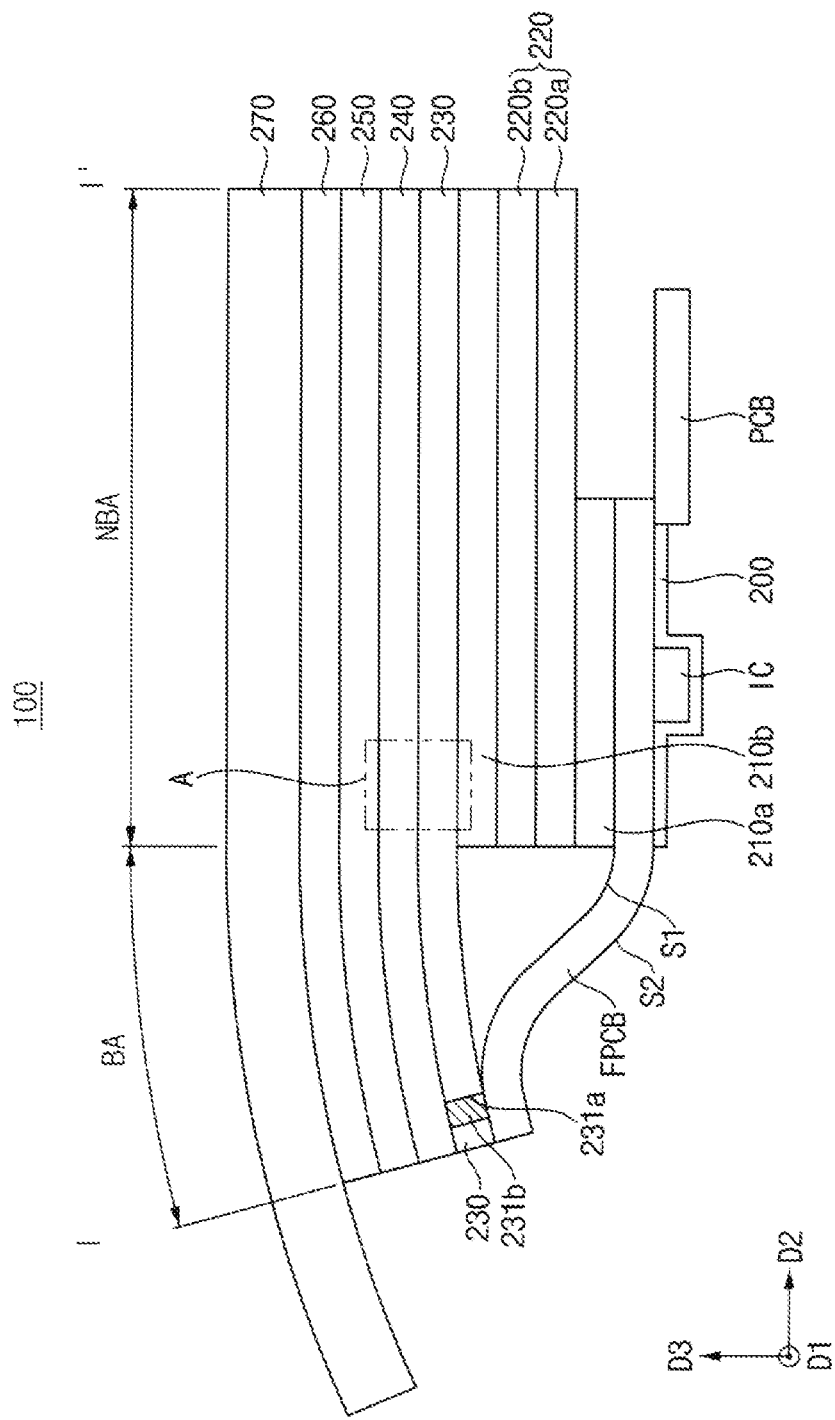
FIG. 2 is a schematic cross-sectional view of the display device of FIG. 1 taken along the line I-I'

FIG. 2 is a schematic cross-sectional view of the display device of FIG. 1 taken along the line I-I'

Referring to FIG. 2, the display device 100 may include a cover window 270, an adhesive layer 260, an optical member 250, a display panel 240, a base substrate 230, a flexible printed circuit board FPCB, a first film 210a, a second film 210b, a protection member 220, a driving circuit chip IC, a printed circuit board PCB, a cover tape 200, and the like.

The optical member 250 may be disposed on the display panel 240. Although not shown in FIG. 2, the optical member 250 may include at least one of a phase retardation plate and a polarizing plate. External light incident from an outside of the cover window 270 may be linearly polarized when passing through the polarizing plate. The linearly polarized incident light may be reflected after passing through the phase retardation plate, may pass through the phase retardation plate again, and may be incident on the polarizing plate. The linearly polarized incident light may pass through the phase retardation plate, may have a phase difference of 45°, and may be circularly polarized to change its phase. As a result, after an external light pass through the phase retardation plate again, the external light may not pass through the polarizing plate and may be mostly extinguished. For example, a light that is circularly polarized with a right rotation while passing through the phase retardation plate may be reflected and changed into circularly polarized a light with a left rotation, and the light that is circularly polarized with a right rotation and the light that is circularly polarized with a left rotation may be extinguished by destructive interference. Accordingly, reflectance of external light of the display device 100 may be reduced.

The base substrate 230 may be disposed under or below the display panel 240. The base substrate 230 may include a transparent or opaque material. According to an embodiment, the base substrate 230 may include a durable heat resistant plastic, such as polyimide (PI), polyethylene terephthalate (PET), and the like. However, the embodiments may be not limited thereto, and the base substrate 230 may include various materials such as a glass material or a metal material.

According to an embodiment, the base substrate 230 overlapping the bending area BA may have a through-hole 231a. A conductive part 231b may be filled in the through-hole 231a. The conductive part 231b may include a conductive material. For example, the conductive material may include a metal material such as aluminum (Al), copper (Cu), and the like. In other embodiments, the conductive part 231b may include a coated electrode terminal.

The flexible printed circuit board FPCB may include a first surface S1 electrically connected to the conductive part 231b and a second surface S2 opposite to the first surface S1.

According to an embodiment, the second surface S2 overlapping the bending area BA may be externally exposed (to the outside). A bending protection layer may not be applied to the second surface S2 overlapping the bending area BA.

The printed circuit board PCB may electrically contact an end of the second surface S2 overlapping the non-bending area NBA. Accordingly, the flexible printed circuit board FPCB may electrically connect the display panel 240 and the printed circuit board PCB. The printed circuit board PCB may output a signal to the display panel 240 through the flexible printed circuit board FPCB or may receive a signal from the display panel 240.

The flexible printed circuit board FPCB may be flexible. For example, the flexible printed circuit board FPCB may include durable heat resistant plastics, such as polyimide, polyethylene terephthalate, and the like. According to an embodiment, a step may be formed in the flexible printed circuit board FPCB overlapping the bending area BA with respect to the base substrate 230. Between the flexible printed circuit board FPCB and the base substrate 230 overlapping the non-bending area NBA, a first film 230a, a protection member 220, and a second film 210b, which will be described later, may be disposed. Therefore, the step may be formed in the flexible printed circuit board FPCB with respect to the base substrate 230.

The driving circuit chip IC may electrically contact the second surface S2 overlapping the non-bending area NBA. The driving circuit chip IC may provide a driving signal to the display device 100. The driving signal may include signals that drive the display device 100 such as a driving voltage, a gate signal, a data signal, and the like.

The cover tape 200 may be disposed on the second surface S2 overlapping the non-bending area NBA and may protect the driving circuit chip IC. According to an embodiment, the cover tape 200 may cover the driving circuit chip IC and may extend along the second surface S2 of the flexible printed circuit board FPCB. The cover tape 200 may extend along the first direction D1 which is a horizontal direction with the second surface S2. For example, the cover tape 200 may include a synthetic resin such as PET and the like.

The first film 210a may contact the first surface S1 overlapping the non-bending area NBA and the second film 210b may contact the rear surface of the base substrate 230 overlapping the non-bending area NBA. The second film 210b may be disposed between the base substrate 230 and a buffer member 220b. The first film 210a and the second film 210b may be transparent films through which light pass through. For example, each of the first film 210a and the second film 210b may include polyethylene terephthalate (PET), polyethylene naphthalene (PEN), polypropylene (PP), polycarbonate (PC), Polystyrene (PS), polysulfone (Psul), polyethylene (PE), polyphthalamide (PPA), polyethersulfone (PES), polyarylate (PAR), polycarbonate oxide (PCO), modified polyphenylene oxide (MPPO), and the like. However, the material of the first film 210a and a material of the second film 210b are not limited thereto.

The protection member 220 may be disposed on the first film 210a. According to an embodiment, the protection member 220 may contact the upper surface of the first film 210a. The protection member 220 may include at least one of the buffer member 220b and a heat dissipation member 220a.

According to an embodiment, the protection member 220 may include the buffer member 220b and the heat dissipation member 220a. The heat dissipation member 220a may be disposed on the first film 210a and the buffer member 220b may be disposed on the heat dissipation member 220a.

The heat dissipation member 220a may include at least one of graphite, copper (Cu), and aluminum (Al) which have suitable heat dissipation properties. However, the material of the heat dissipation member 220a is not limited thereto. The heat dissipation member 220a may improve heat dissipation characteristics and may have electromagnetic wave shielding or electromagnetic wave absorption characteristics.

The buffer member 220b may include a material that may absorb impact. For example, the buffer member 220b may be formed of a polymer resin, or may be a sponge obtained by foam molding a rubber liquid, a urethane-based material, or an acrylic-base material. However, the material of the buffer member 220b is not limited thereto.

The cover window 270 may be disposed on the optical member 250. The cover window 270 may contact the optical member 250 by the adhesive layer 260. For example, the adhesive layer 260 may include an optically transparent adhesive film ("OCA"), a photocurable resin, a thermosetting resin, or the like. However, a material of the adhesive layer 260 is not limited thereto and the adhesive layer 260 may include optical resin ("OCR").

The cover window 270 may include a glass substrate, a sapphire substrate, a plastic substrate, and the like. The cover window 270 may have a multilayer structure or single layer structure. For example, the cover window 270 may include plastic films bonded with an adhesive. In another example, the cover window 270 may include a glass substrate and a plastic film bonded to the glass substrate by an adhesive member.

A conventional display device generally bends a flexible printed circuit board attached to an upper surface of a display panel. A bending protection layer is applied to a second surface of the flexible printed circuit board overlaps a bending area, and a spacer is disposed between a first film and a protection member. Stress applied to the bending area of the flexible printed circuit board may increase and the flexible printed circuit board may be vulnerable to cracks.

In the display device 100 according to the embodiment, the second surface S2 of the flexible printed circuit board FPCB overlapping the bending area BA may be externally exposed (to the outside), and the spacer may not be disposed between the first film 210a and the protection member 220. The flexible printed circuit board FPCB may be connected to the display panel 240 by electrically contacting the conductive part 231b penetrating the base substrate 230 without bending. Accordingly, the size of a bezel area of the display device 100 may be reduced. The occurrence of cracks in the flexible printed circuit board FPCB overlapping the bending area BA may be reduced or may be substantially prevented.

Figure 3:
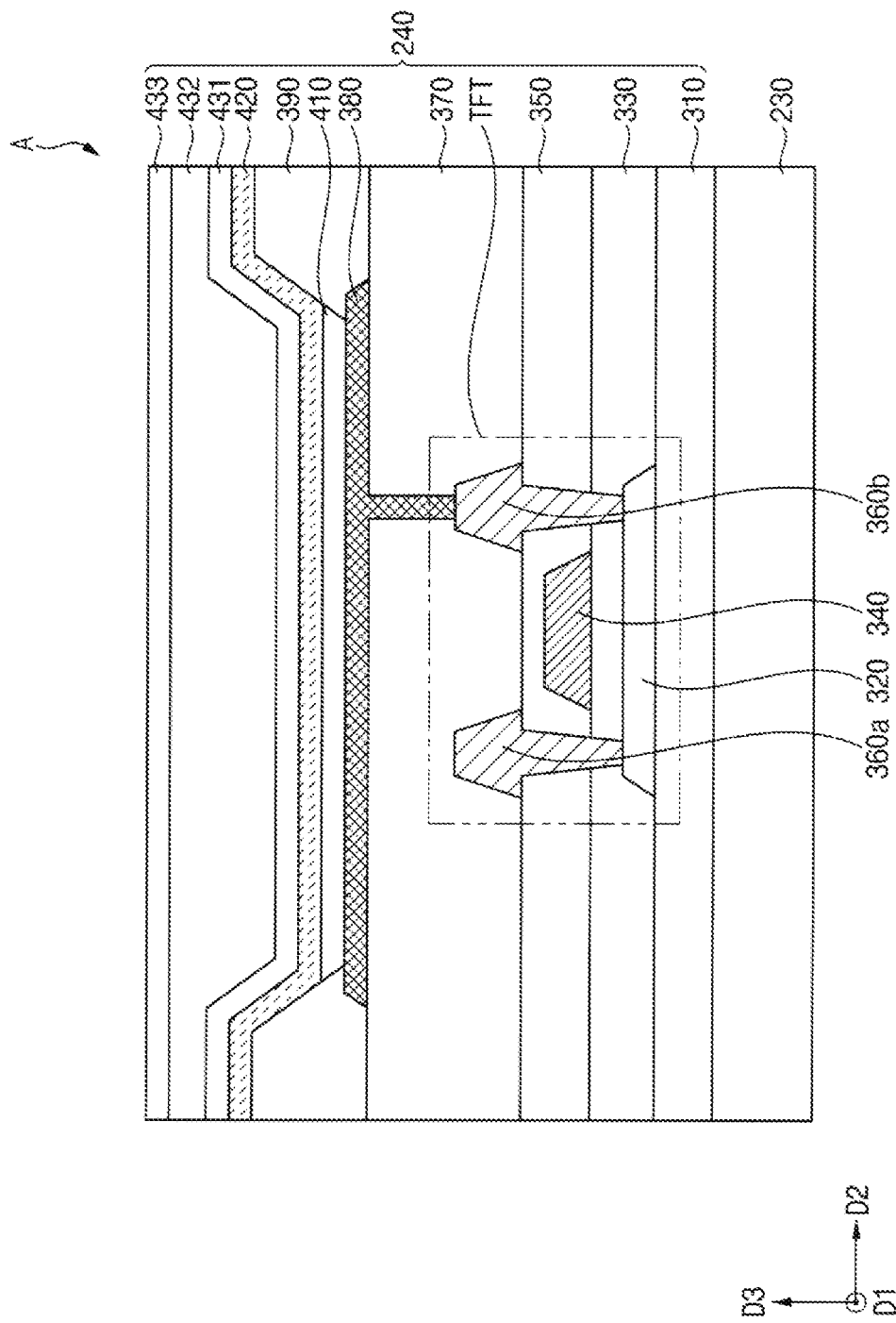
FIG. 3 is an enlarged schematic cross-sectional view illustrating an area 'A' of the display device of FIG. 2.

FIG. 3 is an enlarged schematic cross-sectional view illustrating area 'A' of the display device of FIG. 2.

Referring to FIG. 3, the display device 100 may include the display panel 240 and the base substrate 230. The display panel 240 may include a buffer layer 310, a thin film transistor TFT, a via layer 370, a lower electrode 380, a pixel defining layer 390, an upper electrode 420, an emission layer 410, a first inorganic thin film encapsulation layer 431, an organic thin film encapsulation layer 432, a second inorganic thin film encapsulation layer 433, and the like. The thin film transistor TFT may include an active layer 320, a gate insulating layer 310, a gate electrode 340, an interlayer insulating layer 350, a source electrode 360a, and a drain electrode 360b.

The base substrate 230 may include a transparent or opaque material. For example, as a shape of the display panel 240 has a polygonal planar shape, the base substrate 230 may also have the polygonal planar shape. The base substrate 230 may be formed of a transparent resin substrate. For example, the transparent resin substrate that may be used as the base substrate 230 may be a polyimide substrate.

The buffer layer 310 may be disposed on the base substrate 230. The buffer layer 310 may prevent diffusion of metal atoms or impurities from the base substrate 230 to the thin film transistor TFT. The buffer layer 310 may control a heat transfer rate during a crystallization process for forming the active layer 320 to obtain a substantially uniform active layer 320. In case that the surface of the base substrate 230 is not uniform, the buffer layer 310 may improve the flatness of the surface of the base substrate 230. For example, two or more buffer layers may be disposed on the base substrate 230. The buffer layer 310 may include an organic material or an inorganic material.

The active layer 320 may be disposed on the buffer layer 310. The active layer 320 may include an oxide semiconductor, an inorganic semiconductor, polysilicon, or an organic semiconductor. Although not shown in FIG. 3, the active layer 320 may have a source area and a drain area.

The gate insulating layer 330 may be disposed on the buffer layer 310. The gate insulating layer 310 may sufficiently cover the active layer 310 on the base substrate 230 and may have a substantially flat top surface without generating a step around the active layer 320. As another example, the gate insulating layer 330 may cover the active layer 320 on the base substrate 230 and may be disposed along the profile of the active layer 320 with a uniform thickness.

The gate insulating layer 330 may include a silicon compound, a metal oxide, and the like. For example, the gate insulating layer 330 may include silicon oxide (SiO), silicon nitride (SiN), silicon oxynitride (SiON), silicon oxycarbide (SiOC), silicon carbonitride (SiCN), aluminum oxide (AlO), Aluminum nitride (AlN), tantalum oxide (TaO), hafnium oxide (HfO), zirconium oxide (ZrO), titanium oxide (TiO), and the like. In other embodiments, the gate insulating layer 330 may have a multilayer structure including multiple insulating layers. The insulating layers may have different thicknesses and may include different materials.

The gate electrode 340 may be disposed on the gate insulating layer 330. The gate electrode 340 may be disposed to overlap the active layer 320. The gate electrode 340 may include a metal, an alloy, a metal nitride, a conductive metal oxide, a transparent conductive material, and the like. For example, the gate electrode 340 may include Au, Ag, Al, W, Cu, Pt, Ni, Ti, Pd, Mg, Ca, Li, Cr, Ta, Mo, Sc, Nd, Ir, an alloy containing aluminum, AlN, an alloy containing silver, WN, an alloy containing copper, an alloy containing molybdenum, TiN, CrN, TaN, SrRuO, ZnO, ITO, SnO, InO, GaO, IZO, and the like. These may be used alone or in combination with each other. In other embodiments, the gate electrode 340 may include a multilayer structure including multiple metal layers. The metal layers may have different thicknesses and may include different materials.

The interlayer insulating layer 350 may be disposed on the gate insulating layer 330. The interlayer insulating layer 350 may sufficiently cover the gate electrode 340 and may have a substantially flat top surface without generating a step around the gate electrode 340. In another example, the interlayer insulating layer 350 may cover the gate electrode 340 on the gate insulating layer 330 and may be disposed along the profile of the gate electrode 340 with a uniform thickness. In other embodiments, the interlayer insulating layer 350 may have a multilayer structure including multiple insulating layers. The insulating layers may have different thicknesses or may include different materials.

The source electrode 360a and the drain electrode 360b may be disposed on the interlayer insulating layer 350. Each of the source electrode 360a and the drain electrode 360b may be electrically connected to the source area and the drain area of the active layer 340 through a contact hole formed by removing a part of the gate insulating layer 330 and the interlayer insulating layer 350. Each of the source electrode 360a and the drain electrode 360b may include a metal, an alloy, a metal nitride, a conductive metal oxide, a transparent conductive material, and the like. These may be used alone or in combination with each other. In other embodiments, each of the source electrode 360a and the drain electrode 360b may have a multilayer structure including multiple metal layers. The metal layers may have different thicknesses or may include different materials.

Accordingly, the thin film transistor TFT including the active layer 320, the gate insulating layer 330, the gate electrode 340, the interlayer insulating layer 350, the source electrode 360a and the drain electrode 360b may be disposed on the base substrate 230.

The via layer 370 may be disposed on the interlayer insulating layer 350. The via layer 370 may sufficiently cover the source electrode 360a and the drain electrode 360b. The via layer 370 may be disposed to have a relatively thick thickness. The via layer 370 may have a substantially flat top surface, and a planarization process may be added the via layer 370 to implement such a flat top surface of the via layer 370. In other embodiments, the via layer 370 may be disposed along the profiles of the source electrode 360a and the drain electrode 360b with a uniform thickness on the interlayer insulating layer 350.

The via layer 370 may include an organic material or an inorganic material. According to an embodiment, the via layer 370 may include an organic material. For example, the via layer 370 may include a polyacryl-based resin, a polyimide-based resin, a polyamide-based resin, a siloxane-based resin, an acrylic resin, epoxy-based resin, and the like.

The lower electrode 380 may be disposed on the via layer 370. The lower electrode 380 may be connected to the drain electrode 360b through a contact hole formed by removing a part of the via layer 370. The lower electrode 380 may include a metal, an alloy, a metal nitride, a conductive metal oxide, a transparent conductive material, and the like. These may be used alone or in combination with each other.

The pixel defining layer 390 may be disposed on the via layer 370. The pixel defining layer 390 may cover both sides of the lower electrode 380 and may expose a part of the upper surface of the lower electrode 380. The pixel defining layer 390 may include an organic material or an inorganic material. According to an embodiment, the pixel defining layer 390 may include an organic material.

The emission layer 410 may be disposed on the pixel defining layer 390 and the lower electrode 380. The emission layer 410 may be formed using at least one of emission materials capable of emitting red light, green light, and blue light. The emission layer 410 may include a hole injection layer, a hole transport layer, an organic emission layer, an electron transport layer, an electron injection layer, and the like. For example, the emission layer 410 may include a low molecular weight organic compound or a high molecular weight organic compound.

The upper electrode 420 may be disposed on the emission layer 410 and the pixel defining layer 390. The upper electrode 420 may include a metal, an alloy, a metal nitride, a conductive metal oxide, a transparent conductive material, and the like. These may be used alone or in combination with each other.

A first inorganic thin film encapsulation layer 431 may be disposed on the upper electrode 420. The first inorganic thin film encapsulation layer 431 may cover the upper electrode 420 and may be disposed along the profile of the upper electrode 420 with a uniform thickness. The first inorganic thin film encapsulation layer 431 may prevent the emission layer 410 from deteriorating due to penetration of moisture or oxygen. The first inorganic thin film encapsulation layer 431 may also serve to protect the display panel 240 from external impact. The first inorganic thin film encapsulation layer 431 may include flexible inorganic materials.

The organic thin film encapsulation layer 432 may be disposed on the first inorganic thin film encapsulation layer 431. The organic thin film encapsulation layer 432 may improve the flatness of the display panel 240 and may protect the display panel 240. The organic thin film encapsulation layer 432 may include flexible organic materials.

The second inorganic thin film encapsulation layer 433 may be disposed on the organic thin film encapsulation layer 432. The second inorganic thin film encapsulation layer 433 may cover the organic thin film encapsulation layer 432 and may be disposed along the profile of the organic thin film encapsulation layer 432 with a uniform thickness. The second inorganic thin film encapsulation layer 433 together with the first inorganic thin film encapsulation layer 431 may prevent the emission layer 410 from deteriorating due to penetration of moisture or oxygen. The second inorganic thin film encapsulation layer 433 may also protect the display panel 240 together with the first inorganic thin film encapsulation layer 431 and the organic thin film encapsulation layer 432 from external impact. The second inorganic thin film encapsulation layer 433 may include flexible inorganic materials.

Accordingly, the display panel 240 including the thin film transistor TFT, the via layer 370, the lower electrode 380, the pixel defining layer 390, the emission layer 410, the upper electrode 420, the first inorganic thin film encapsulation layer 431, the organic thin film encapsulation layer 432 and the second inorganic thin film encapsulation layer 433 may be disposed on the base substrate 230.

Figure 4:
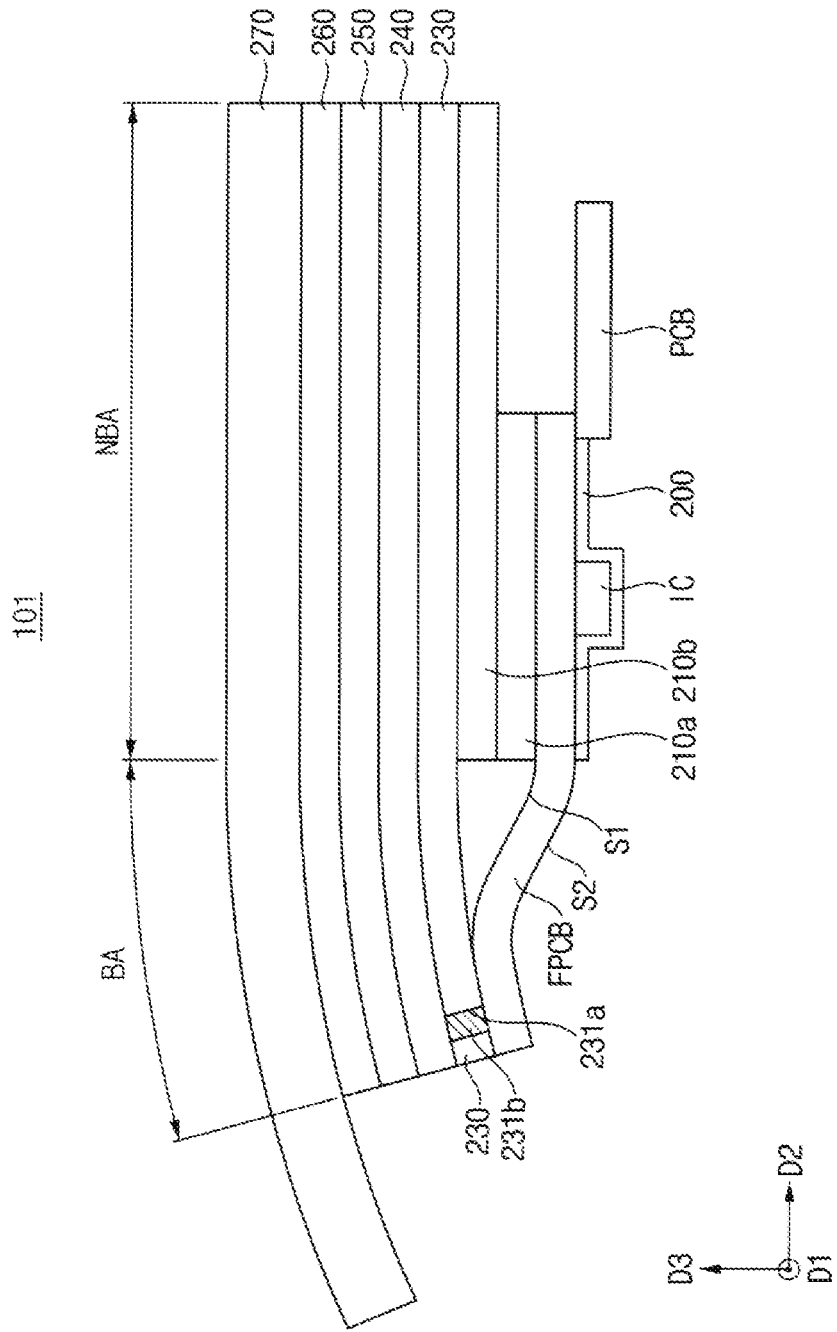
FIG. 4 is a schematic cross-sectional view illustrating a display device according to an embodiment.

FIG. 4 is a schematic cross-sectional view illustrating a display device according to an embodiment.

Referring to FIG. 4, the display device 101 may include a cover window 270, an adhesive layer 260, an optical member 250, a display panel 240, a base substrate 230, a flexible printed circuit board FPCB, a first film 210a, a second film 210b, a driving circuit chip IC, a printed circuit board PCB, a cover tape 200, and the like. However, the display device 101 may be substantially the same as the display device 100 described with reference to FIG. 2 except that the protection member 220 is not included. Hereinafter, a portion not including the protection member 220 will be described.

The first film 210a may contact the first surface S1 of the flexible printed circuit board FPCB overlapping the non-bending area NBA. According to an embodiment, the second film 210b may contact an upper surface of the first film 210a. The protection member 220 shown in FIG. 2 may not be disposed between the first film 210a and the second film 210b. Accordingly, the step formed in the flexible printed circuit board FPCB overlapping the bending area BA with respect to the base substrate 230 may be reduced, and an occurrence of cracks in the flexible printed circuit board FPCB may be reduced or substantially prevented.

FIGS. 5, 6, 7, and 8 are schematic cross-sectional views illustrating a method of manufacturing a display device according to an embodiment.

Figure 5:
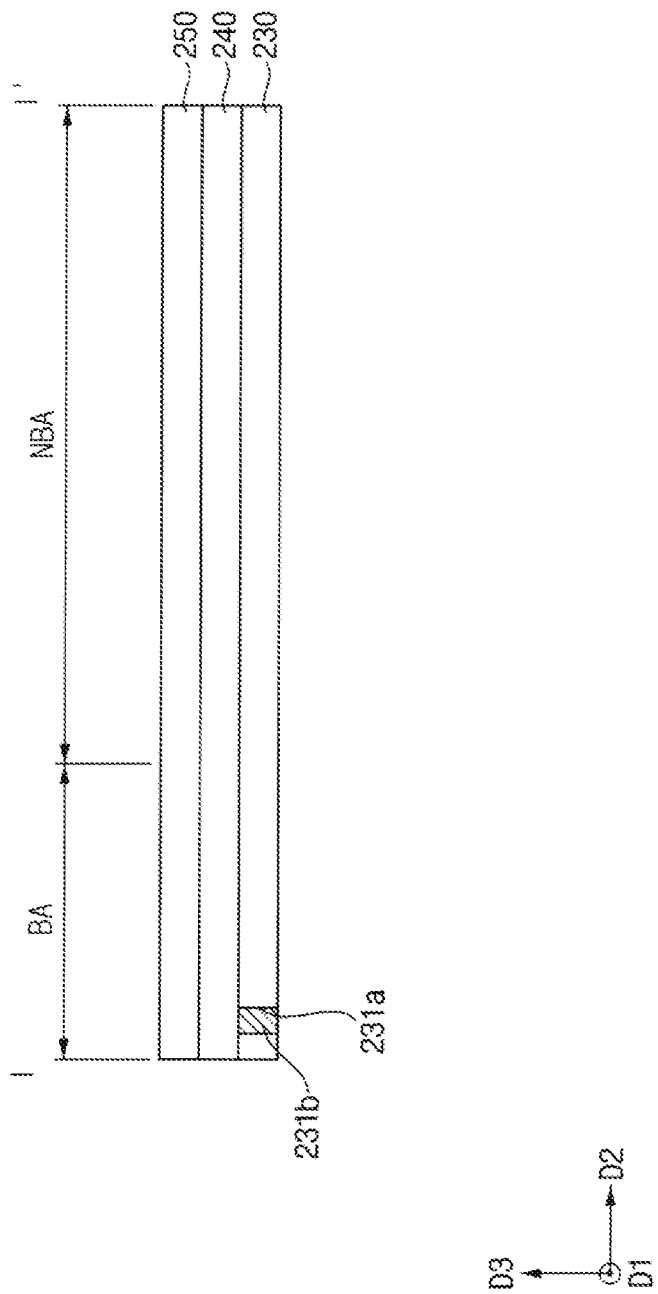
FIGS. 5, 6, 7, and 8 are schematic cross-sectional views illustrating a method of manufacturing a display device according to an embodiment.

Referring to FIG. 5, the display panel 240 may be formed on the base substrate 230. According to an embodiment, the through-hole 231a may be formed by removing a part of the base substrate 230 overlapping the bending area BA in the third direction D3. The conductive part 231b may be formed in the through-hole 231a. For example, the conductive part 231b may be formed using a conductive material. The conductive material may include a metal material such as aluminum (Al), copper (Cu), and the like. In other examples, the conductive part 231b may be formed using a coated electrode terminal.

The optical member 250 may be formed on the display panel 240. Although not shown in FIG. 5, the optical member 250 may contact an upper surface of the display panel 240 through an adhesive. For example, the adhesive may include an optically transparent adhesive film ("OCA"), a photocurable resin, a thermosetting resin, or the like.

Figure 6:
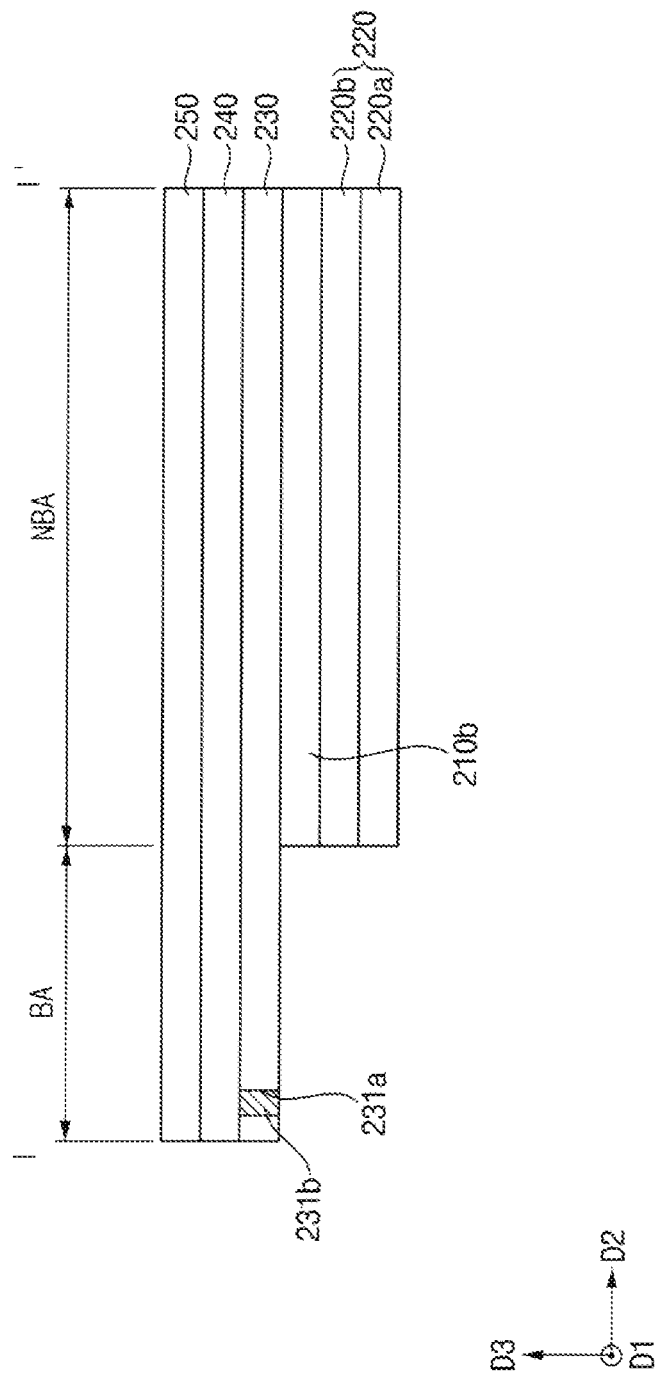

Referring to FIG. 6, the second film 210b may be formed under or below the base substrate 230 overlapping the non-bending area NBA. The second film 210b may contact the rear surface of the base substrate 230. For example, the second film 210b may include polyethylene terephthalate, polyethylene naphthalene, polypropylene, polycarbonate, polystyrene, and the like.

The protection member 220 may be formed under or below the second film 210b. The protection member 220 may contact the rear surface of the second film 210b. The protection member 220 may include at least one of the buffer member 220b and the heat dissipation member 220a. According to an embodiment, the protection member 220 may include the buffer member 220b and the heat dissipation member 220a.

Figure 7:
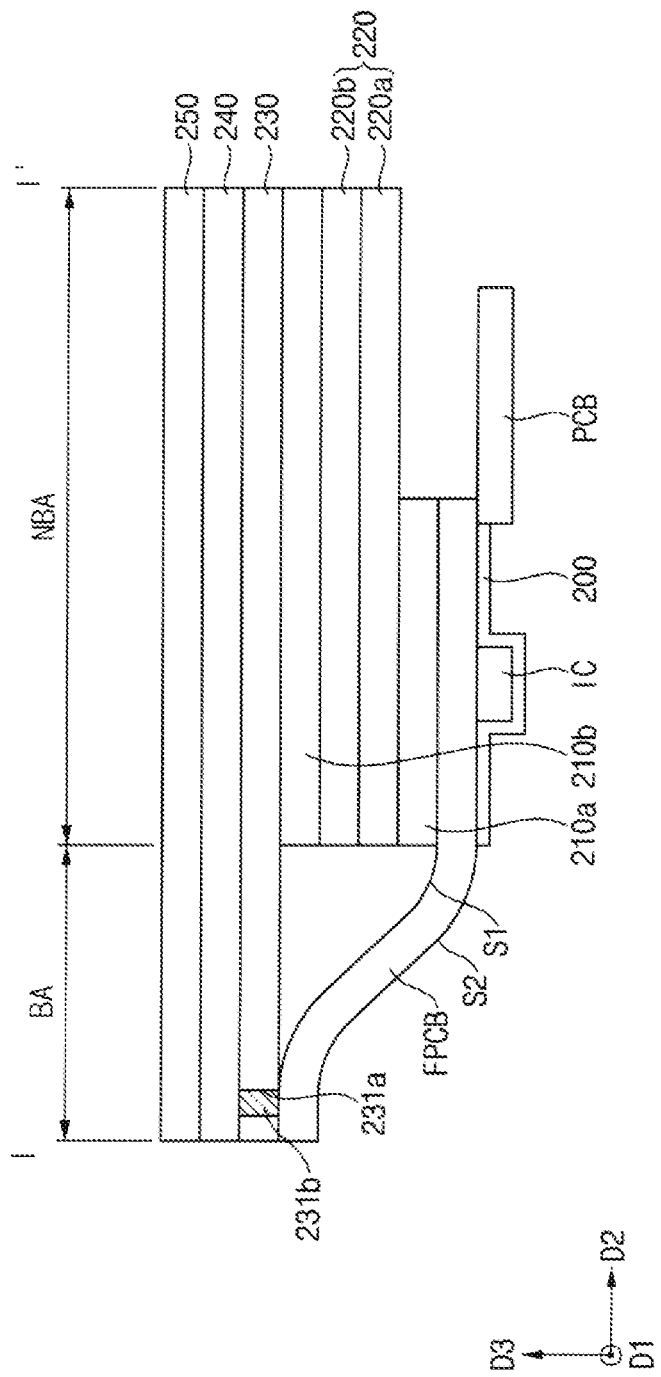

Referring to FIG. 7, the driving circuit chip IC may contact the second surface S2 of the flexible printed circuit board FPCB overlapping the non-bending area NBA. According to an embodiment, the flexible printed circuit board FPCB may include polyimide and the like.

The printed circuit board PCB may contact an end of the second surface S2 of the flexible printed circuit board FPCB overlapping the non-bending area NBA. The first film 210a may be formed on the first surface S1 of the flexible printed circuit board FPCB overlapping the non-bending area NBA. For example, the first film 210a may include polyethylene terephthalate, polyethylene naphthalene, polypropylene, polycarbonate, polystyrene, and the like.

The first surface S1 of the flexible printed circuit board FPCB, which may be coupled to the driving circuit chip IC and the printed circuit board PCB, may be connected to the conductive part 231b of the base substrate 230. Accordingly, a step may be formed in the flexible printed circuit board FPCB overlapping the bending area BA with respect to the base substrate 230, and an upper surface of the first film 210a may contact the protection member 220.

Figure 8:
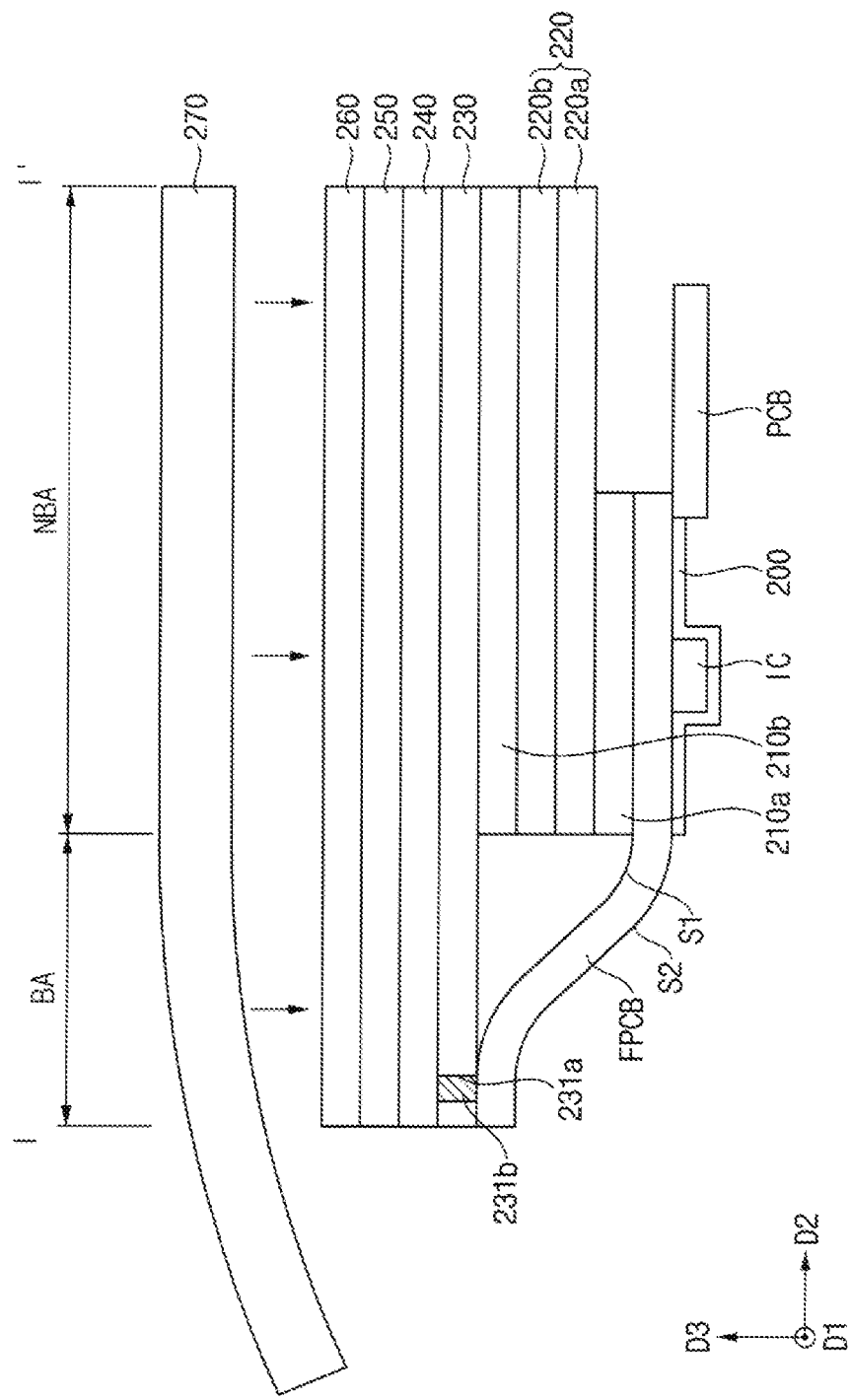

Referring to FIG. 8, the cover window 270 may contact an upper surface of the optical member 250. The cover window 270 may contact the upper surface of the optical member 250 through the adhesive layer 260. For example, the adhesive layer 260 may include an optically transparent adhesive film ("OCA"), a photocurable resin, a thermosetting resin, or the like. The cover window 270 overlapping the bending area BA may be bent in a direction opposite to the third direction D3. For example, the cover window 270 may include a glass substrate, a sapphire substrate, a plastic substrate, and the like.

The cover tape 200 covering the driving circuit chip IC may be formed on the second surface S2 of the flexible printed circuit board FPCB and may protect the driving circuit IC. The cover tape 200 may be formed to cover the driving circuit chip IC and may extend along the second surface S2. According to an embodiment, the cover tape 200 may be formed to extend in a first direction D1 which is a horizontal direction to the second surface S2. For example, the cover tape 200 may include a synthetic resin such as PET.

After the cover window 270 is attached to the upper surface of the optical member 250, the optical member 25, the display panel 240, the base substrate 230, and the flexible printed circuit board FPCB overlapping the bending area BA may be bent along a curved surface of the cover window 270.

Accordingly, the display device 100 shown in FIG. 2 may be manufactured.

Figure 9:
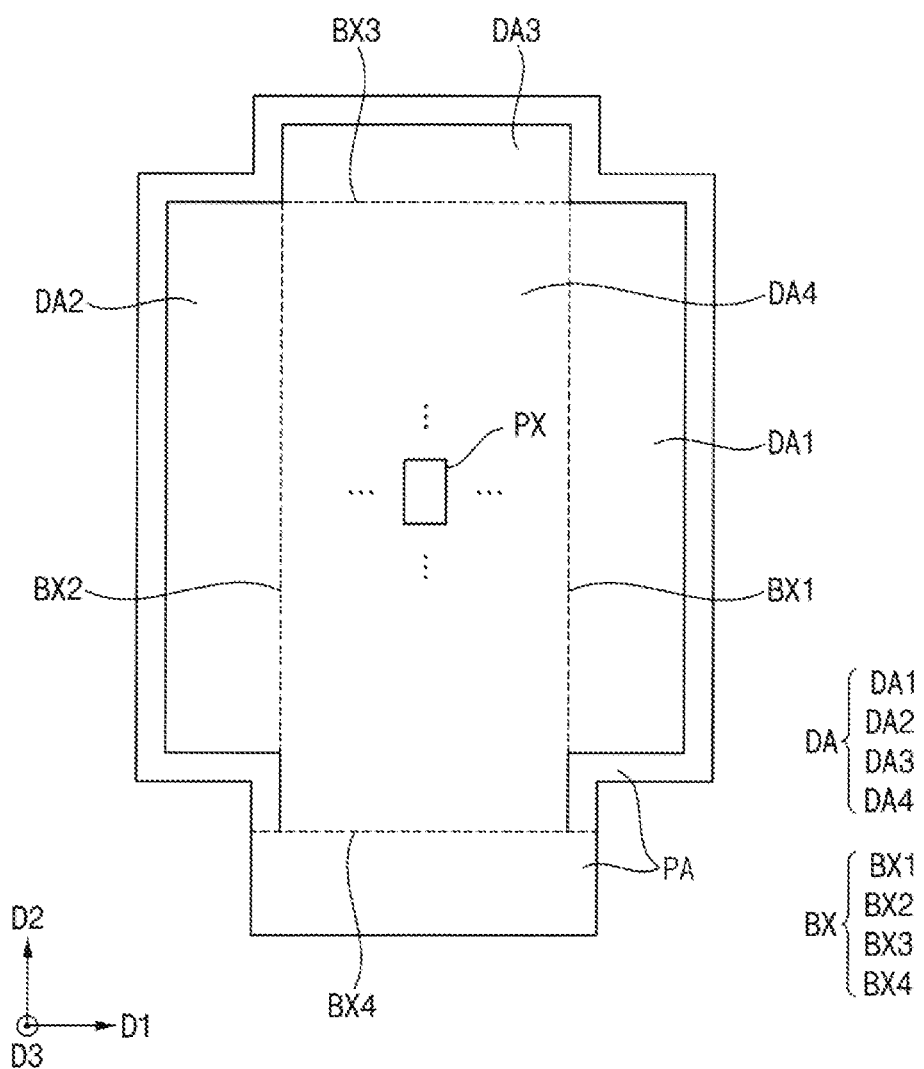
FIG. 9 is a schematic plan view illustrating a display device according to an embodiment.

FIG. 9 is a schematic plan view illustrating a display device according to an embodiment.

Referring to FIG. 9, the display device 102 according to an embodiment may have a structure capable of being bent based on four bending axes BX1, BX2, BX3, and BX4.

The display device 102 may include a display area DA, and a peripheral area PA adjacent to the display area DA and surrounding the display area DA. The display area DA may include a first display area DA1, a second display area DA2, a third display area DA3, and a fourth display area DA4.

According to an embodiment, a part of the display area DA may be bent to have a side display area. The first display area DA1, the second display area DA2, and the third display area DA3 may correspond to the side display area, and the fourth display area DA4 may correspond to a front display area.

According to an embodiment, the first display area DA1 may be located in a first direction D1, the second display area DA2 may be located in a direction opposite to the first direction D1, the display area DA3 may be located in the second direction D2, and the fourth display area DA4 may be located on a front side.

In each of the display areas DA1, DA2, DA3, and DA4, an array of pixels PX including an organic light emitting element may be disposed and may generate light according to a driving signal.

According to an embodiment, the display device 102 may be bent in the first direction D1 around the first bending axis BX1, may be bent in a direction opposite to the first direction D1 around the second bending axis BX2, may be bent in the second direction D2 around the first bending axis BX3, and may be bent in a direction opposite to the second direction D2 around the second bending axis BX4.

Although not shown in detail in FIG. 9, a part of the fourth bending axis BX4 of the display device 102 may correspond to the bending area BA of the display device 100 shown in FIG. 1. The peripheral area PA located or below the display device 102 may be a part where the flexible printed circuit board FPCB, the driving circuit chip IC, and the printed circuit board PCB of the display device 100 shown in FIG. 1.

The embodiments may be applied to a display device and electronic devices using the same. For example, the embodiments may be applied to a mobile phone, a smart phone, a video phone, a smart pad, a smart watch, a tablet PC, a vehicle navigation system, a television, a computer monitor, a laptop computer, and the like.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
a display panel including a bending area and a non-bending area adjacent to the bending area;
a base substrate disposed under the display panel and including a through-hole overlapping the bending area;
a conductive part filling the through-hole;
a flexible printed circuit board including:
a first surface connected to the conductive part; and
a second surface opposite to the first surface;
a first film contacting the first surface of the flexible printed circuit board overlapping the non-bending area; and
a protection member contacting an upper surface of the first film.

2. The display device of claim 1, wherein the second surface of the flexible printed circuit board overlapping the bending area is exposed.

3. The display device of claim 1, wherein a step is formed in the flexible printed circuit board overlapping the bending area with respect to the base substrate.

4. The display device of claim 1, wherein the protection member includes:
a heat dissipation member disposed on the first film; and
a buffer member disposed on the heat dissipation member.

5. The display device of claim 4, further comprising:
a second film disposed between the buffer member and the base substrate.

6. The display device of claim 1, wherein the base substrate and the flexible printed circuit board include a same material.

7. The display device of claim 6, wherein the base substrate and the flexible printed circuit board include plastic.

8. The display device of claim 1, further comprising:
a driving circuit chip contacting the second surface of the flexible printed circuit board overlapping the non-bending area.

9. The display device of claim 8, further comprising:
a cover tape covering the driving circuit chip and extending along the second surface of the flexible printed circuit board.

10. The display device of claim 9, further comprising:
a printed circuit board spaced apart from the driving circuit chip and contacting an end of the second surface of the flexible printed circuit board.

11. The display device of claim 1, further comprising:
an optical member disposed on the display panel; and
a cover window disposed on the optical member.

12. The display device of claim 11, wherein the cover window includes plastic.

13. A display device comprising:
a display panel including a bending area and a non-bending area adjacent to the bending area;
a base substrate disposed under the display panel and including a through-hole overlapping the bending area;
a conductive part filling the through-hole;
a flexible printed circuit board including:
a first surface connected to the conductive part; and
a second surface opposite to the first surface;
a first film contacting the first surface of the flexible printed circuit board overlapping the non-bending area; and
a second film contacting an upper surface of the first film.

14. The display device of claim 13, wherein the second surface of the flexible printed circuit board overlapping the bending area is exposed.

15. The display device of claim 13, wherein the second film is disposed between the first film and the base substrate.

* * * * *